(12) United States Patent
Kokubun et al.

(10) Patent No.: US 7,332,357 B2
(45) Date of Patent: Feb. 19, 2008

(54) METHOD FOR FABRICATING SEMICONDUCTOR DEVICE

(75) Inventors: Yuriko Kokubun, Kawasaki (JP); Tetsuo Yaegashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 11/212,603

(22) Filed: Aug. 29, 2005

(65) Prior Publication Data
US 2006/0148108 A1    Jul. 6, 2006

(30) Foreign Application Priority Data
Jan. 6, 2005 (JP) ............... 2005-001301

(51) Int. Cl.
*H01L 21/00* (2006.01)
(52) U.S. Cl. ............... 438/3; 438/238; 257/E21.664
(58) Field of Classification Search ............ 438/3, 438/190, 238, 239, 240, 244, 250, 253, 381, 438/393, 396, 397, 689, 690, 691; 257/E27.049, 257/E29.345, E21.008, E21.396, E21.664
See application file for complete search history.

(56) References Cited

U.S. PATENT DOCUMENTS

| | | | |
|---|---|---|---|
| 5,431,958 A | * | 7/1995 | Desu et al. ............ 427/255.32 |
| 5,774,327 A | * | 6/1998 | Park ....................... 361/321.5 |
| 6,115,233 A | * | 9/2000 | Seliskar et al. ............ 361/303 |
| 6,521,927 B2 | * | 2/2003 | Hidaka et al. ............. 257/295 |
| 6,872,618 B2 | * | 3/2005 | Lee et al. .................. 438/240 |
| 2005/0064605 A1 | * | 3/2005 | Lee et al. ...................... 438/3 |

FOREIGN PATENT DOCUMENTS

| | | |
|---|---|---|
| JP | 06-32613 | 2/1994 |
| JP | 2000-340767 | 12/2000 |
| JP | 2002-170938 | 6/2002 |
| JP | 2002-203915 | 7/2002 |
| JP | 2002-324984 | 11/2002 |
| JP | 2002-334970 | 11/2002 |
| JP | 2003-282560 | 10/2003 |

\* cited by examiner

*Primary Examiner*—Brook Kebede
(74) *Attorney, Agent, or Firm*—Westerman, Hattori, Daniels & Adrian, LLP.

(57) ABSTRACT

A conduction film 36 is formed in a larger design thickness value on a ferroelectric film 32 by MOCVD, and the entire surface of the conduction film 36 is anisotropically etched back, whereby the surface morphology of the conduction film 36 can be improved. The conduction film 36, whose surface morphology has been improved and which has been flattened, can be patterned by photolithography without the reflection of the incident exposure light in various directions, and a desired pattern as designed can be formed. The method for fabricating a semiconductor device can improve the surface morphology of a ferroelectric film formed by organic metal chemical vapor deposition.

15 Claims, 11 Drawing Sheets

METHOD FOR FABRICATING SEMICONDUCTOR DEVICE

CROSS-REFERENCE TO RELATED APPLICATIONS

This application is based upon and claims the priority benefit of Japanese Patent Application No. 2005-001301 filed on Jan. 6, 2005, the content being incorporated herein by reference.

BACKGROUND OF THE INVENTION

The present invention relates to a method for fabricating a semiconductor device, more specifically a method for fabricating a semiconductor device fabricating method in which a ferroelectric film is formed by metal organic chemical vapor deposition.

Recently the use of ferroelectric materials as the dielectric films of capacitors is noted. FeRAM (Ferroelectric Random Access Memory) using such ferroelectric capacitors is a prospective nonvolatile memory having characteristics of high speed operation, low electric power consumption, read/write durability, etc.

As materials of such ferroelectric film, ferroelectric materials of layer perovskite structure, PZT (Lead Zirconate Titanate), etc. are noted. To from such ferroelectric film, MOCVD (Metal Organic Chemical Vapor Deposition), which can deposit ferroelectric films on large-area substrates at high speed and with good step covering is noted.

In forming a ferroelectric film by MOCVD, cavities and convexities are formed in the surface of the ferroelectric film due to the crystal structure, etc. with resultant problem of the rough surface morphology. When concavities and convexities are formed in the surface of the ferroelectric film, the concavities and convexities are formed also in the surface of a conduction film formed thereon. When a resist is applied to such conduction film, and light is applied to the conduction film to expose the resist, the incident light is randomly reflected on the concavities and convexities in the surface of the conduction film, which makes it difficult to form patterns with high accuracy.

In trying to solve this problem, insulation film is buried in cavities in the surface of the ferroelectric film to thereby improve the surface morphology (see Patent Reference 1 and Patent Reference 2). Various tries to flatten concavities and convexities in films have been made (see Patent Reference 4, Patent Reference 5 and Patent Reference 6).

The Patent Reference 1 is Specification of Japanese Patent Application Unexamined Publication No. 1994-32613. The Patent Reference 2 is Specification of Japanese Patent Application Unexamined Publication No. 2003-282560. The Patent Reference 3 is Specification of Japanese Patent Application Unexamined Publication No. 2002-170938. The Patent Reference 4 is Specification of Japanese Patent Application Unexamined Publication No. 2002-334970. The Patent Reference 5 is Specification of Japanese Patent Application Unexamined Publication No. 2002-203915. The Patent Reference 6 is Specification of Japanese Patent Application Unexamined Publication No. 2000-340767. The Patent Reference 7 is Specification of Japanese Patent Application Unexamined Publication No. 2002-324894.

However, the method of filling cavities in the ferroelectric film surface with insulation film cannot sufficiently improve the surface morphology and also leaves the insulation film buried in the ferroelectric film surface, and has a problem of deteriorating the characteristics of the ferroelectric capacitor.

The conventional methods for flattening concavities and convexities in the surfaces of films are difficult to apply to flattening the surface of the conduction film of the ferroelectric capacitor.

SUMMARY OF THE INVENTION

An object of the present invention is to provide a method for fabricating a semiconductor device which can improve the surface morphology of a conduction film formed on a ferroelectric film formed by metal organic chemical vapor deposition.

The above-described object is attained by a method for fabricating a semiconductor device comprising the steps of: forming a ferroelectric film by metal organic chemical vapor deposition; forming a conduction film on the ferroelectric film; and etching a surface of the conduction film to flatten the surface of the conduction film.

The above-described object is attained by a method for fabricating a semiconductor device comprising the steps of: forming a ferroelectric film by metal organic chemical vapor deposition; forming a conduction film on the ferroelectric film; forming a buried layer for filling concavities in the surface of the conduction film; removing tops of convexities in a surface of the conduction film by etching from above the buried layer to flatten the surface of the conduction film; and removing the buried layer remaining on the surface of the conduction film.

The method for fabricating a semiconductor device according to the present invention comprises the step of forming a ferroelectric film by organic metal chemical vapor deposition, the step of forming a conduction film on the ferroelectric film, the step of etching the surface of the conduction film to flatten the surface of the conduction film, whereby he surface morphology of the conduction film formed on the ferroelectric film formed by organic metal chemical deposition can be improved.

DETAILED DESCRIPTION OF THE INVENTION

A First Embodiment

Figure 1:
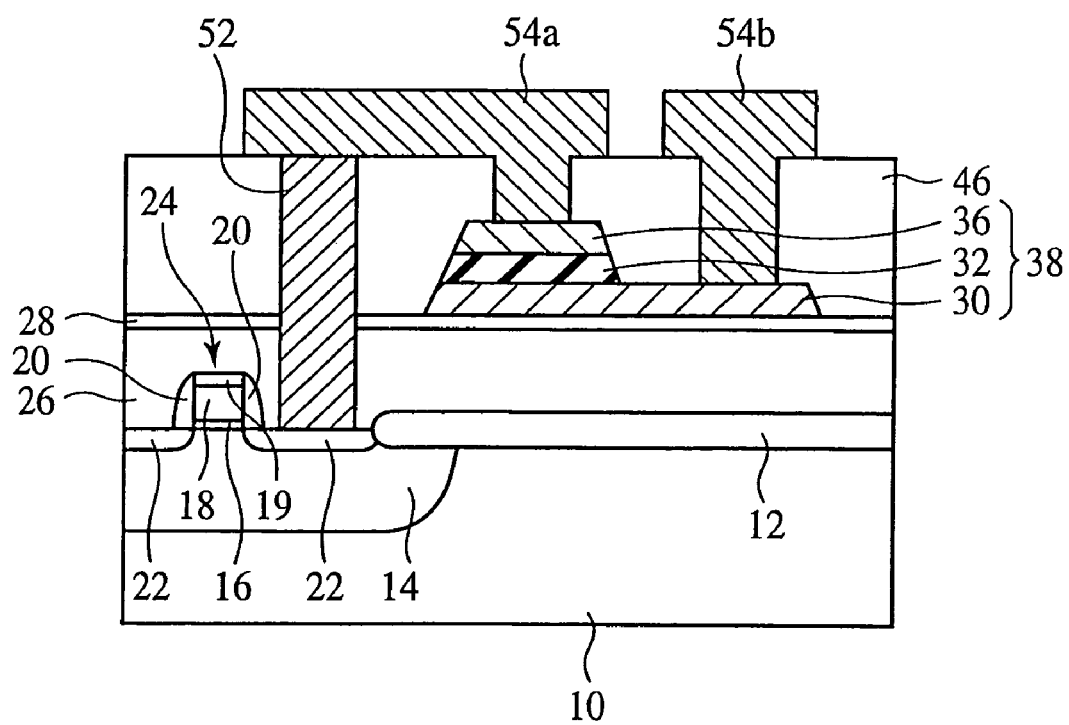
FIG. 1 is a sectional view of the semiconductor device according to a first embodiment of the present invention.
Figure 7A:
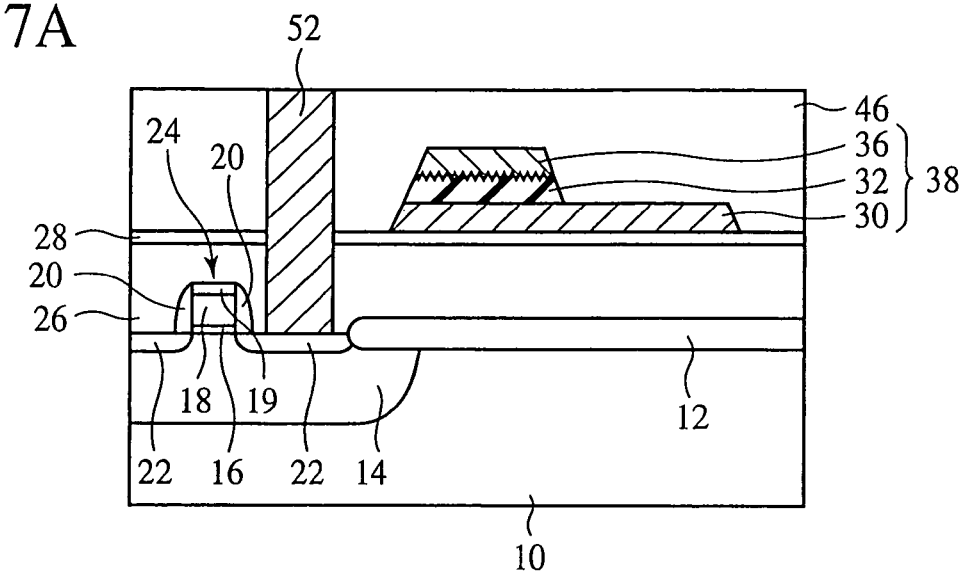
FIGS. 7A-7B are sectional views of the semiconductor device according to the first embodiment of the present invention in the steps of the method for fabricating the semiconductor device (Part 6).
Figure 7B:
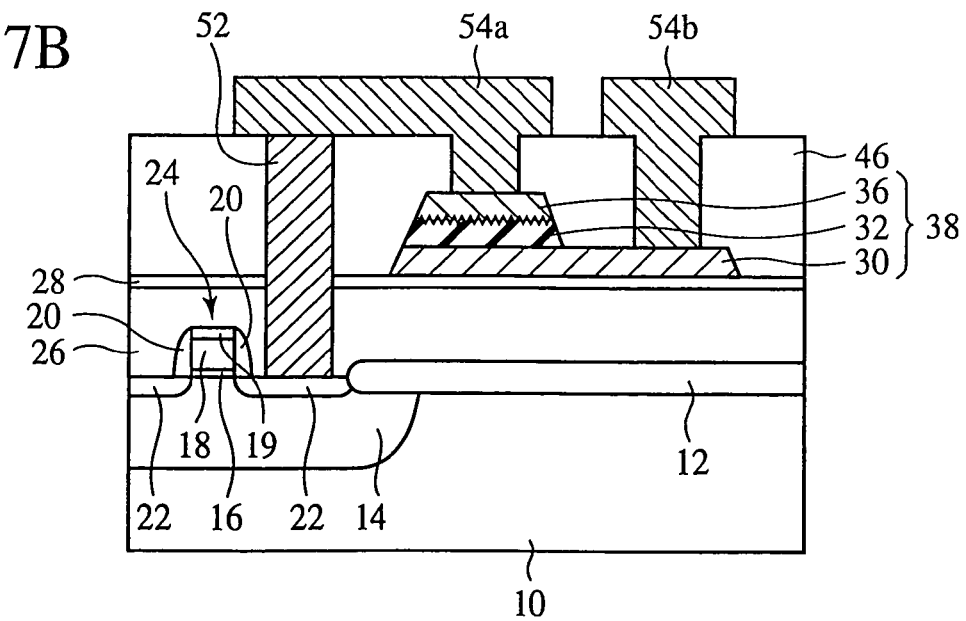
Figure 8:
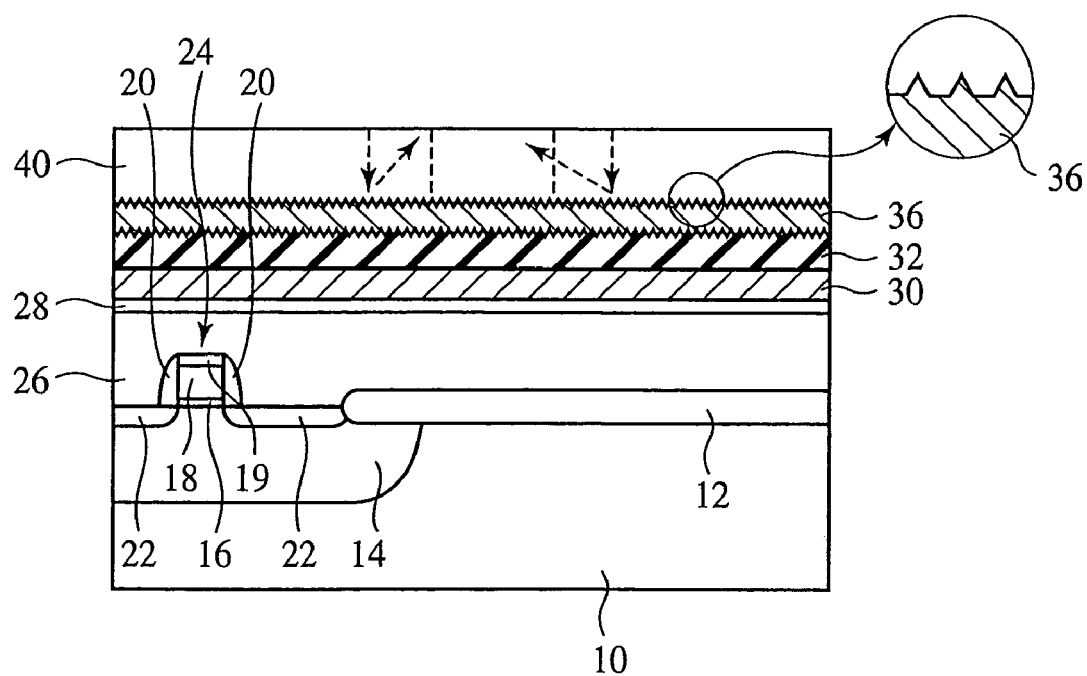
FIG. 8 is a view illustrating a problem of the conventional semiconductor device fabricating method.

The method for fabricating a semiconductor device according to a first embodiment of the present invention will be explained with reference to FIGS. 1 to 9. FIG. 1 is a sectional view of the semiconductor device according to the present embodiment, which illustrates a structure thereof. FIGS. 2 to 7 are sectional views of the semiconductor device in the steps of the method for fabricating the semiconductor device according to the present embodiment, which illustrate the method. FIG. 8 is a view illustrating problems of the conventional semiconductor device fabricating methods. FIG. 9 is views illustrating effects of the semiconductor device fabricating method according to the present embodiment.

(The Semiconductor Device)

The structure of the semiconductor device according to the present embodiment will be explained with reference to FIG. 1.

As illustrated in FIG. 1, a device isolation region for defining a device region is formed on a semiconductor substrate 10 of, e.g., silicon. A well 14 is formed in the semiconductor substrate 10 with the device isolation region 12 formed in.

On the semiconductor substrate 10 with the well 14 formed in, a gate electrode (gate line) 18 is formed with a gate insulation film 16 formed therebetween. The gate electrode 18 has the polycide structure of, e.g., a metal silicide film, such as tungsten silicide film or others, formed on a polysilicon film. An insulation film 19 of silicon oxide film is formed on the gate electrode 18. A sidewall insulation film 20 is formed on the side walls of the gate electrode 18 and the insulation film 19.

A source/drain diffused layer 22 is formed on both sides of the gate electrode 18 with the sidewall insulation film 20 formed on. Thus, a transistor 24 including the gate electrode 18 and the source/drain diffused layer 22 is formed.

On the semiconductor substrate 10 with the transistor 24 formed on, an inter-layer insulation film 26 of a silicon oxide film, of, e.g., a 700-800 nm thickness is formed. The surface of the inter-layer insulation film 26 is planarized.

On the inter-layer insulation film 26, a silicon oxide film of, e.g., a 100 nm thickness is formed. Because of the silicon oxide film 28 formed on the planarized inter-layer 26, the silicon oxide film 28 is planarized.

On the silicon oxide film 28, a lower electrode 30 of a ferroelectric capacitor 38 is formed. The lower electrode 30 is formed on a Pt film of, e.g., a 150-200 nm thickness.

On the lower electrode 30, a ferroelectric film 32 of the ferroelectric capacitor 38 is formed. The ferroelectric film 32 is formed of a $PbZr_{1-x}Ti_xO_3$ film (PZT film) of, e.g., a 100-150 nm thickness.

On the ferroelectric film 32, an upper electrode 36 of the ferroelectric capacitor 38 is formed. The upper electrode 36 is formed of an $IrO_x$ film of, e.g., a 150-250 nm thickness.

Thus, the ferroelectric capacitor comprising the lower electrode 30, the ferroelectric film 32 and the upper electrode 36 is formed.

On the ferroelectric capacitor 38, an inter-layer insulation film 46 of a silicon oxide film of, e.g., a 1100 nm thickness is formed. The surface of the inter-layer insulation film is planarized.

In the inter-layer insulation film 46, the silicon oxide film 28 and the inter-layer insulation film 26, a contact hole is formed down to the source/drain diffused layer 22, and a conductor plug 52 of tungsten is buried in the contact hole.

In the inter-layer insulation film 46, contact holes are formed respectively down to the upper electrode 36 and down to the lower electrode 30. On the inter-layer insulation film 46, an interconnection 54a and an interconnection 54b are formed electrically connected respectively to the conductor plug 52 and the upper electrode 36, and to the lower electrode 30.

Thus, the source/drain diffused layer 22 of the transistor 24 and the upper electrode 36 of the ferroelectric capacitor 38 are electrically connected to each other via the conductor plugs 52 and the interconnection 54a, forming a 1T (Transistor) 1C (Cell) type memory cell of an FeRAM including 1 transistor 24 and 1 ferroelectric capacitor 38. Such memory cells are arranged in the memory cell region of an FeRAM chip.

(The Method for Fabricating the Semiconductor Device)

Next, the method for fabricating a semiconductor device according to the present embodiment will be explained with reference to FIGS. 2 to 7.

First, the device isolation region 12 for defining the device region is formed on a semiconductor substrate 10 of, e.g., silicon by, e.g., LOCOS (LOCal Oxidation of Silicon).

Then, a dopant impurity is implanted by ion implantation to form the well 14.

Figure 2A:
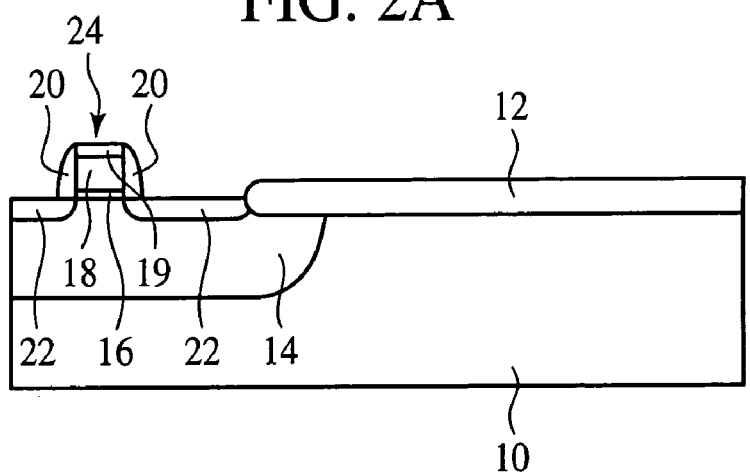
FIGS. 2A-2C are sectional views of the semiconductor device according to the first embodiment of the present invention in the steps of the method for fabricating the semiconductor device (Part 1).

Next, the transistor 24 comprising the gate electrode (gate line) 18 and the source/drain diffused layer 22 is formed by the usual transistor fabricating method (FIG. 2A).

Figure 2B:
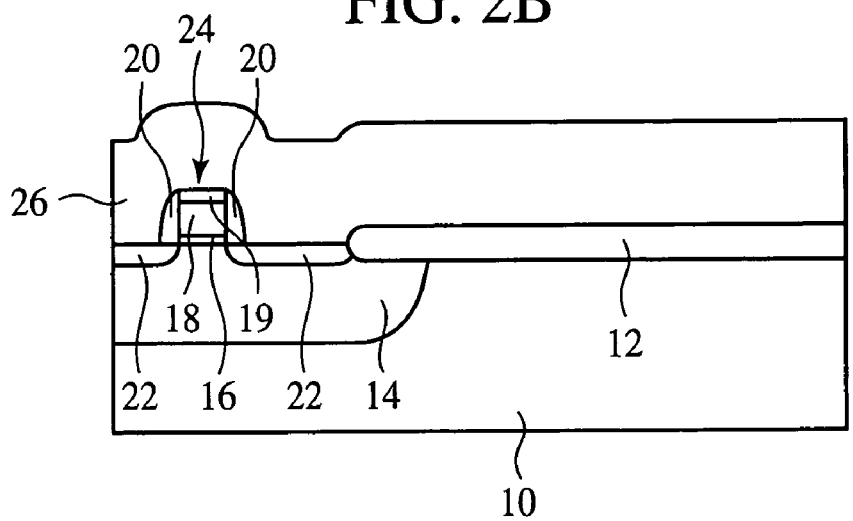

Next, a silicon oxide film of, e.g., a 600 nm thickness is deposited on the entire surface by, e.g., plasma TEOSCVD (Chemical Vapor Deposition) to form the inter-layer insulation film 26 (FIG. 2B).

Figure 2C:
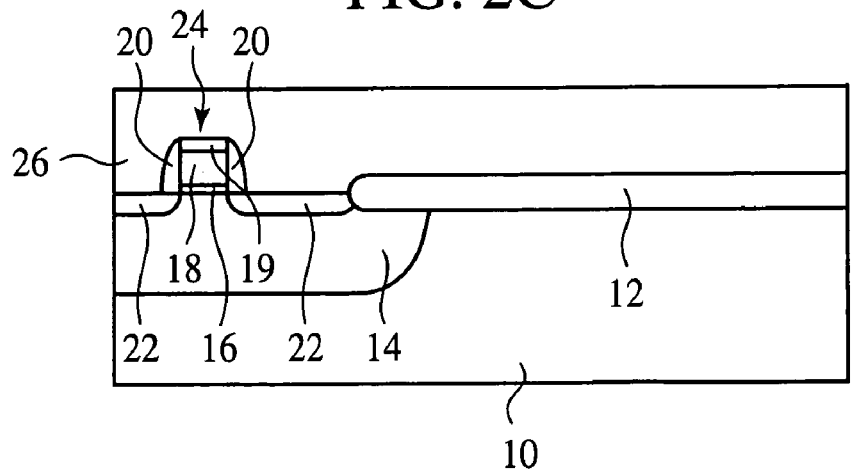

Next, the surface of the inter-layer insulation film 26 is planarized by, e.g., CMP (FIG. 2C).

Figure 3A:
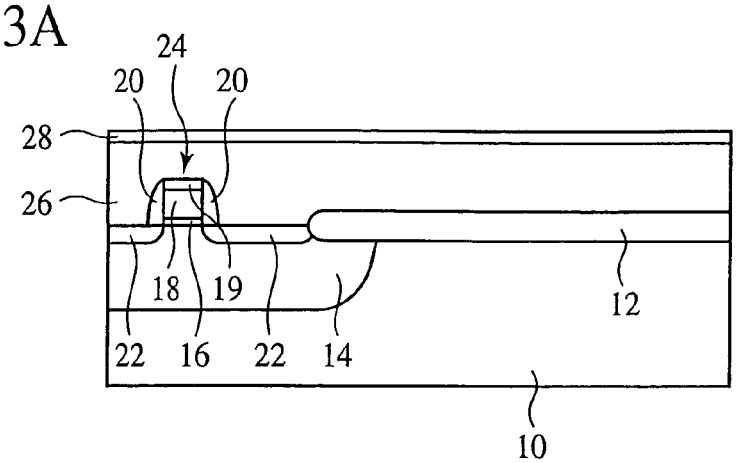
FIGS. 3A-3C are sectional views of the semiconductor device according to the first embodiment of the present invention in the steps of the method for fabricating the semiconductor device (Part 2).

Next, a silicon oxide film 28 of, e.g., a 100 nm thickness is formed on the entire surface by, e.g., plasma TEOSCVD (FIG. 3A).

Then, a Pt film 30 of, e.g., a 150-200 nm thickness is formed on the entire surface by, e.g., sputtering or MOCVD. The Pt film 30 is to be the lower electrode of the ferroelectric capacitor 38 (FIG. 3B).

Figure 3B:
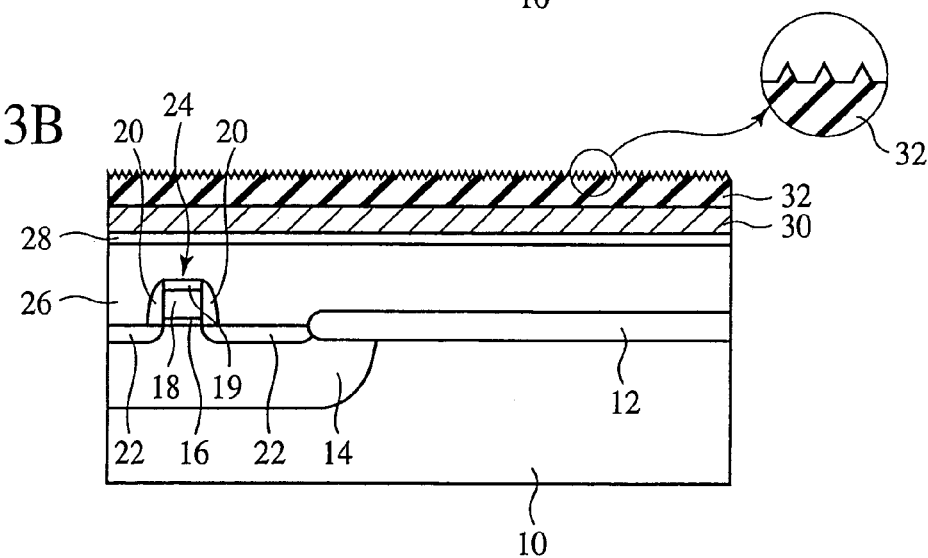

Next, the ferroelectric film 32 is formed on the entire surface by MOCVD (Metal Organic Chemical Vapor Deposition) (FIG. 3B).

Conditions for the MOCVD at this time are $Pb(Dtm)_2$, $Zr(Dmhd)_4$ and $Ti(O-Ipr)_2(Dtm)_2$, for example, as the metal organic compounds, and a reaction pressure of, e.g., 5 Torr.

Figure 3C:
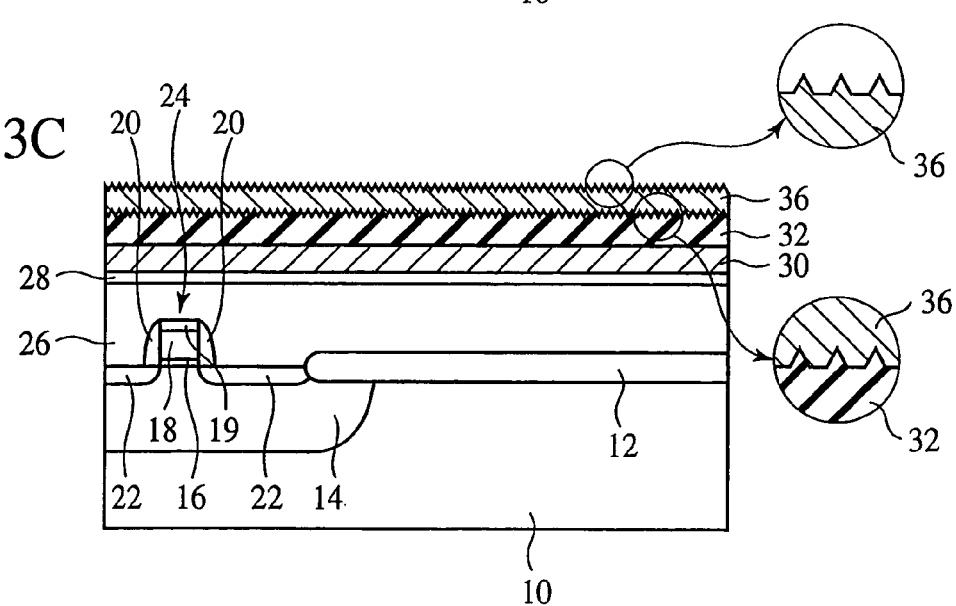

Then, the conduction film 36 of, e.g., a 150-150 nm thickness $IrO_x$ film is formed by, e.g., sputtering or MOCVD (FIG. 3C).

When the PZT film, which is the ferroelectric film 32, is formed by MOCVD, large concavities and convexities are formed in the surface of the PZT film, and the surface morphology is becomes rough. For example, 10-20 nm height convexities are formed in the surface of the PZT film. The surface morphology of the ferroelectric film 3 is reflected as it is also on the conduction film 36 formed on the ferroelectric film 32, and the surface morphology of the conduction film 36 also becomes rough (FIG. 3C).

The case that the fabrication of the semiconductor device goes on without making any remedial processing for the rough surface morphology will be explained with reference to FIG. 8.

A resist layer 40 is applied to the conduction, and when a prescribed pattern is exposed on the resist layer 40, the exposure incident light is reflected on the concavities and convexities in the surface of the conduction film 36 in various directions, causing halation (FIG. 8). Resultantly, the resist layer 40 is not exposed in the prescribed patter as designed, which makes it impossible to pattern the conduction film 36 as designed.

Figure 4A:
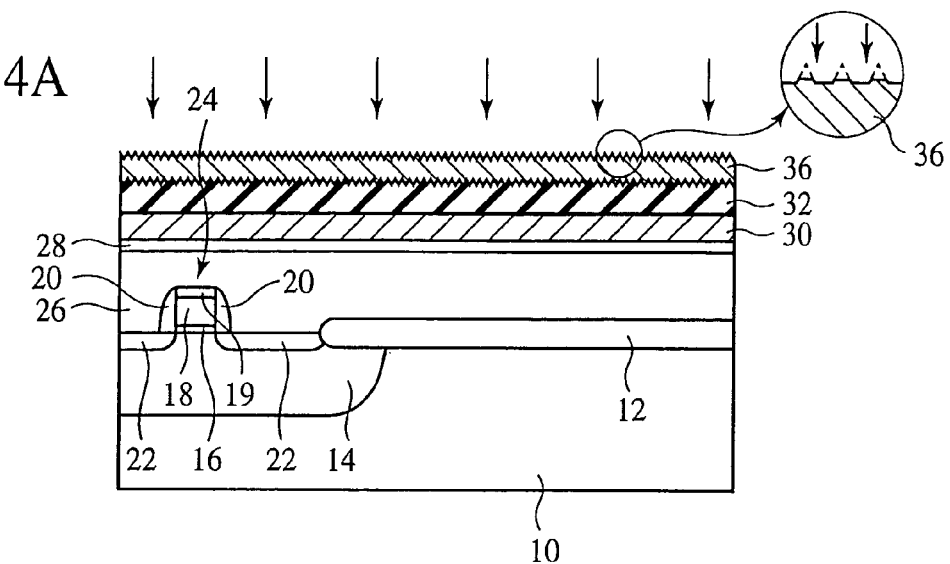
FIGS. 4A-4C are sectional views of the semiconductor device according to the first embodiment of the present invention in the steps of the method for fabricating the semiconductor device (Part 3).
Figure 4B:
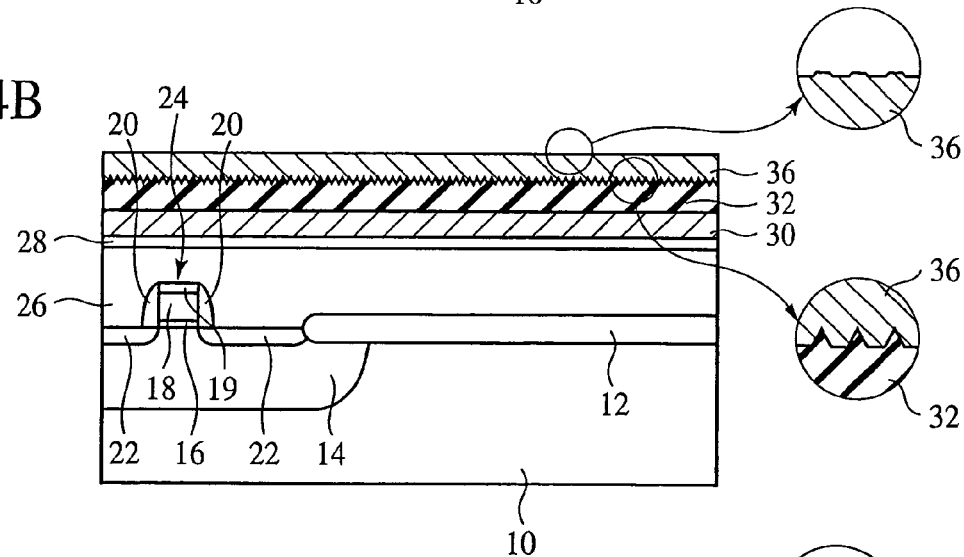

Then, in the present embodiment, the surface morphology of the conduction film 36 is improved by the method illustrated in FIGS. 4A and 4B.

The conduction film 36 is formed thicker in advance than the desired thickness. For example, when a 150-250 nm $IrO_x$ film is required as the upper electrode, the conduction film 36 of the $IrO_x$ film of a 30-50 nm thickness, which is thicker by about 20%, is formed (FIG. 3C).

Then, the entire surface of the conduction film 36 is etched back by etching, such as anisotropic etching, plasma etching, reactive ion etching, sputtering or others (FIG. 4A). At this time, the tops of the convexities in the surface of the conduction film 36 are more etched off. The height of the convexities of the conduction film 36, which have been 10-20 nm, is thus reduced to about 3-5 nm, and the surface of the conduction film 36 is generally flattened (FIG. 4B).

Conditions for the sputter etching at this time are, e.g., chlorine ($Cl_2$) gas and argon (Ar) gas as the etching gas, e.g., a 1400 W source power and, e.g., an 800 W bias power.

Thus, the surface morphology of the conduction film 36 is improved.

Figure 4C:
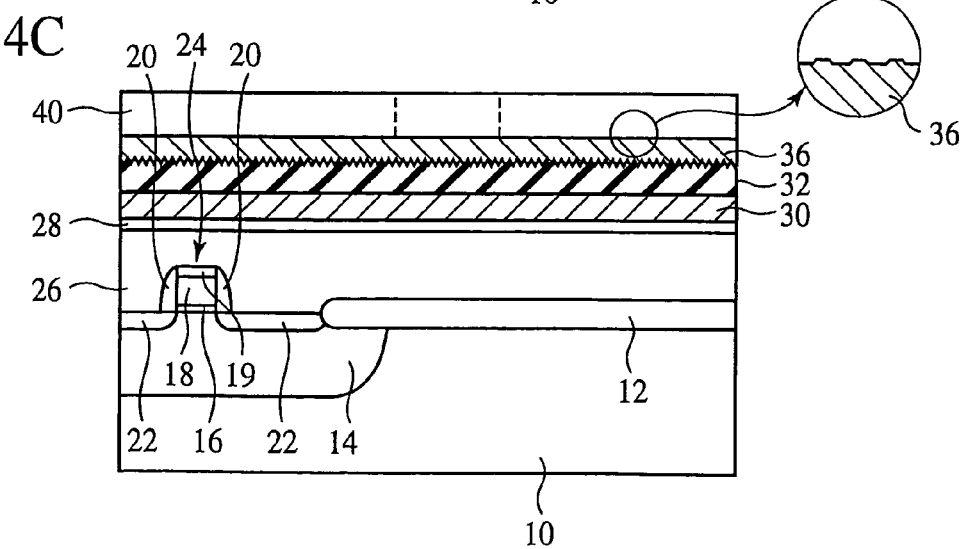

Next, when the resist layer 40 is applied to the conduction film 36, and the prescribed pattern is exposed on the resist layer 40, because of the surface morphology of the conduction film 36 which has been improved to be flat, the incident exposure light is not reflected in various directions, and the resist layer 40 is exposed in the prescribed pattern as designed (FIG. 4C).

Figure 5A:
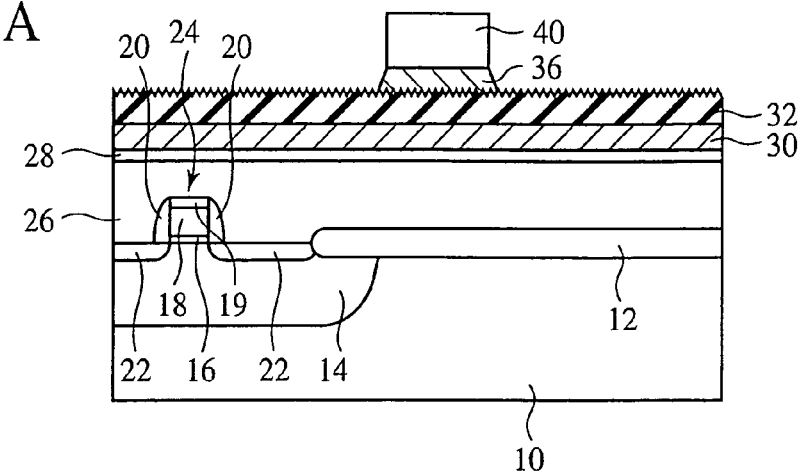
FIGS. 5A-5C are sectional views of the semiconductor device according to the first embodiment of the present invention in the steps of the method for fabricating the semiconductordevice (Part 4).

Next, the resist layer 40 is developed, and with the patterned resist layer 40 as the mask, the conduction film 36 is etched to form the upper electrode 36 (FIG. 5A).

Figure 5B:
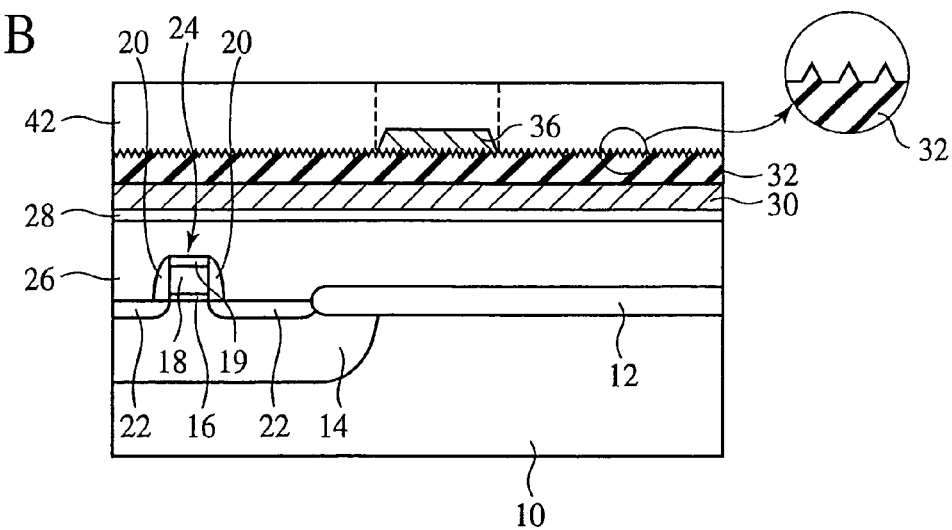

Then, a resist layer 42 is applied to the ferroelectric film 32, and a prescribed pattern is exposed on the resist layer 42 (FIG. 5B).

Figure 5C:
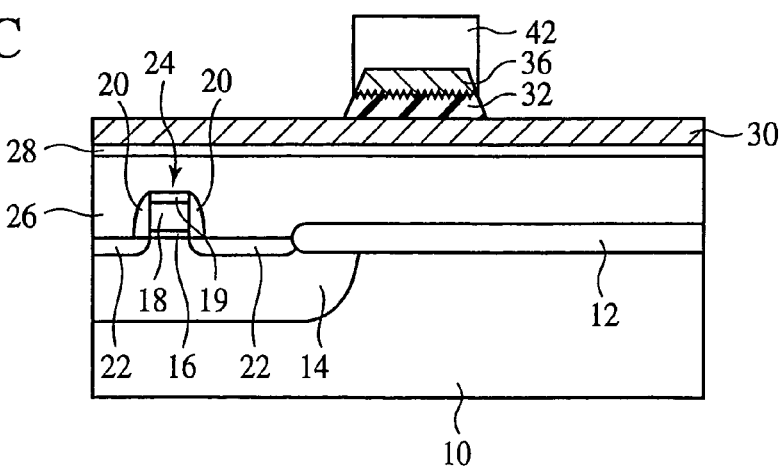

Then, the resist layer 42 is developed and patterned, and with the patterned resist layer 42 as the mask, the ferroelectric film 32 is patterned (FIG. 5C).

Figure 6A:
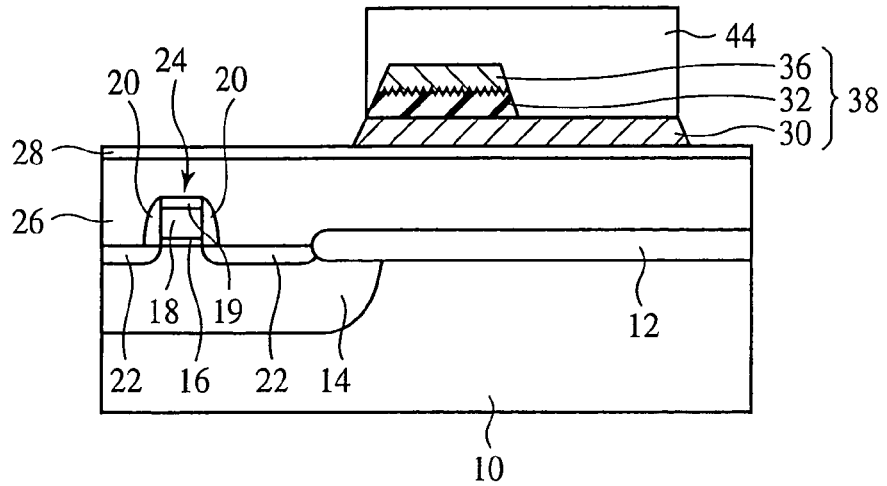
FIGS. 6A-6C are sectional views of the semiconductor device according to the first embodiment of the present invention in the steps of the method for fabricating the semiconductor device (Part 5).

Next, the resist layer 44 is patterned in the same way, and with the patterned resist layer 44 as the mask, the conduction film 30 is etched to form the lower electrode 30 (FIG. 6A).

Figure 6B:
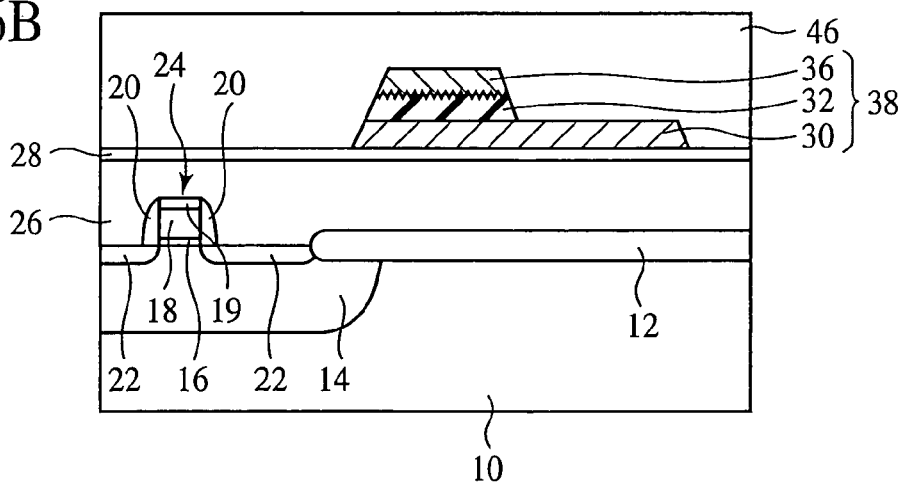

Next, the inter-layer insulation film 46 of a silicon oxide film of, e.g., a 1500 nm thickness is formed on the entire surface by, e.g., plasma TEOSCVD. Then, the surface of the inter-layer insulation film 46 is planarized by, e.g., CMP (FIG. 6B).

Figure 6C:
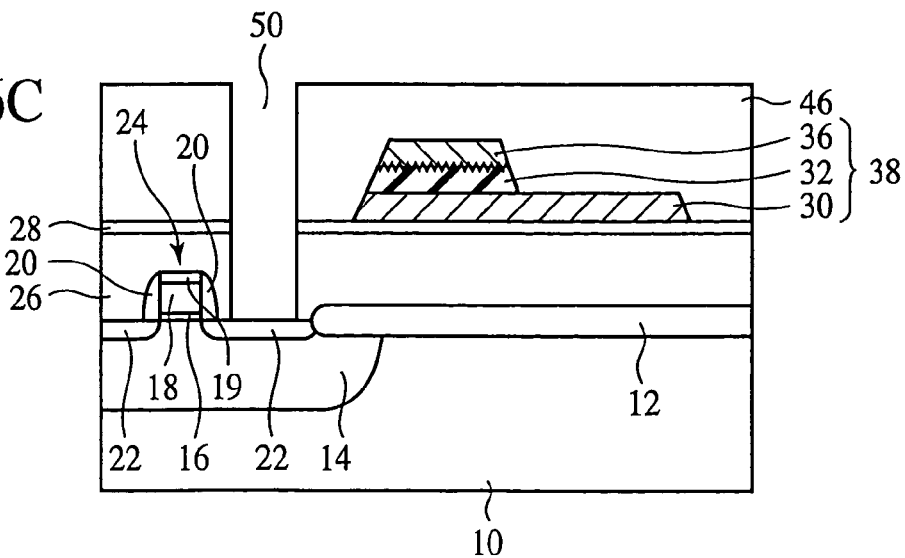

Then, by photolithography and etching, the contact hole 50 is formed in the inter-layer insulation film 46, the silicon oxide film 28 and the inter-layer insulation film 26 down to the source/drain diffused layer 22 (FIG. 6C).

Then, a tungsten film of, e.g., a 500 nm thickness is formed on the entire surface by, e.g., CVD.

Then, the tungsten film and the barrier metal film are polished by, e.g., CMP until the surface of the inter-layer insulation film 46 is exposed. Thus, the conductor plug 52 of tungsten is buried in the contact hole 50 (FIG. 7A).

Next, by photolithography and dry etching, the contact holes are formed in the inter-layer insulation film 46 respectively down to the upper electrode 36 of the ferroelectric capacitor 38 and down to the lower electrode 30 of the ferroelectric capacitor 38.

Then, the conduction film of, e.g., a TiN film, An AlCu alloy film, a Ti film, a TiN film, etc. laid one on another is formed on the entire surface. Then, the conduction film is patterned by photolithography and dry etching to form the interconnection 54a electrically connecting the upper electrode 36 of the ferroelectric capacitor and the conductor plug 52 to each other, and the interconnection 54b electrically connected to the lower electrode 30 of the ferroelectric capacitor 38 (FIG. 7B).

As described above, according to the present embodiment, the conduction film 36 which is thicker than the design value is formed on the ferroelectric film 32 formed by MOCVD, and the entire surface of the conduction film 36 is anisotropically etched back, whereby the surface morphology of the conduction film 36 can be improved. Because of the surface morphology of the conduction film 36 which has been improved to be flat, when the conduction film 36b is patterned by photolithography, the incident exposure light is not reflected in various direction, and a desired pattern as designed can be formed.

Specific effects of the present embodiment will be explained with reference to FIG. 9.

FIG. 9 shows picturesf of the semiconductor device taken from above, which is in the state that the entire surface of the conduction film 36 has been anisotropically etched back, the conduction film 36 has been patterned, and the upper electrode 36 is formed (FIG. 5A). This picture shows the surface morphology of the upper electrode 36.

Figure 9A:
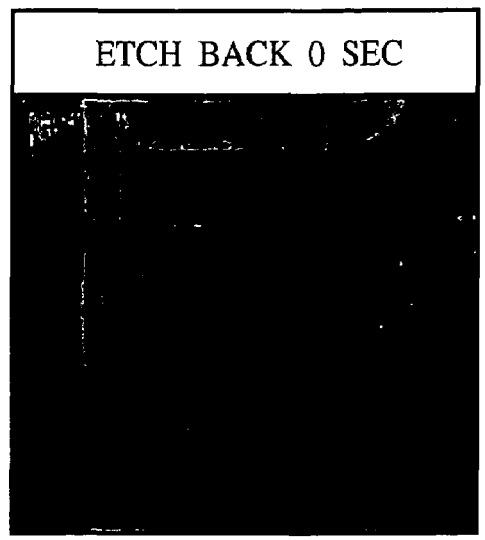
FIGS. 9A-9C are views explaining an effect of the method for fabricating a semiconductor device according to the first embodiment of the present invention.
Figure 9B:
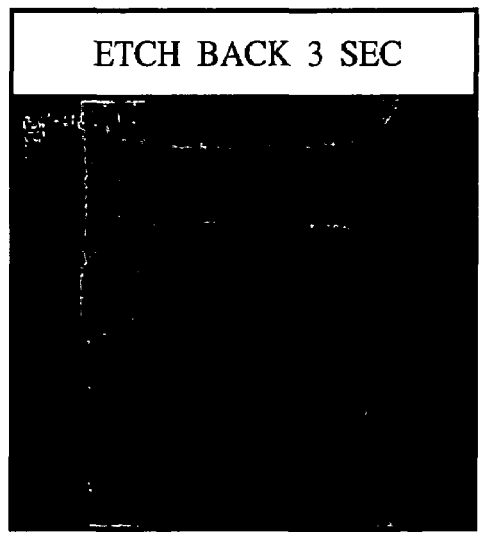
Figure 9C:
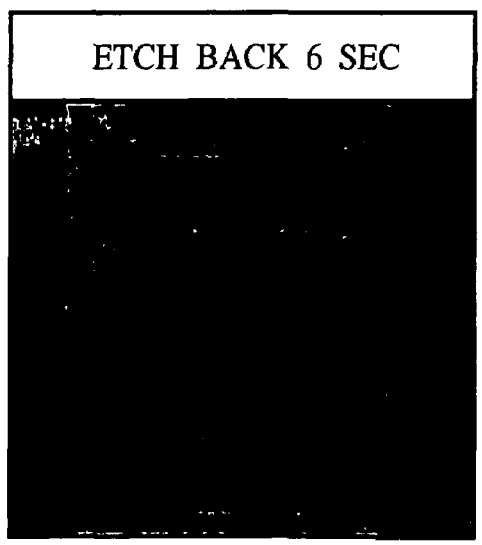

FIGS. 9A, 9B and 9C show the surface morphologies of the conduction film 36 which has been etched respectively for 0 second, 3 seconds and 6 seconds. That is, when the etching period of time was 0 second, that is, the etching was not performed, a number of convexities were present in the conduction film 36. However, when the etching period of time was 3 seconds, the number of the convexities in the surface of the conduction film 36 was decreased. Furthermore, when the etching period of time was 6 seconds, the convexities in the surface of the conduction film 36 were substantially absent. Thus, the sufficient etching of the upper surface of the conduction film 36 decreased the convexities in the surface of the conduction film 36 and improved the surface morphology of the conduction film 36.

In the present embodiment, the surface morphology of the conduction film 36 is improved, but the surface morphology of the ferroelectric film 32 is not improved. Accordingly, there is a risk that when the resist layer 42 is applied to the ferroelectric film 32, and the prescribed pattern is exposed on the resist layer 42, the incident exposure light may be reflected in various directions, and the desired pattern as designed may not be exposed. However, this can be less influential on the performance of the semiconductor device because the design values of the ferroelectric film 32 are less nanonized than those of the conduction film 36.

The present embodiment is applied here to fabricating a semiconductor device of the FeRAM structure including the planar cell, which requires the patterning of the ferroelectric film 32. However, the surface morphology of the ferroelectric film 32 is not important in applying the present embodiment to the stacked cell, in which the upper electrode 36, the ferroelectric film 32 and the lower electrode 30 are concurrently patterned by once etching, and accordingly the step of patterning the ferroelectric film 32 alone is not required.

A Second Embodiment

The method for fabricating a semiconductor device according to a second embodiment of the present embodiment will be explained with reference to FIG. 10. FIG. 10 is sectional views of the semiconductor device according to the second embodiment in the steps of the method for fabricating the semiconductor device, which illustrate the method.

The method for fabricating a semiconductor device according to the present embodiment is different from the first embodiment in the method for improving the surface morphology of the conduction film 36. In the present embodiment, the surface morphology of the ferroelectric film 32 is improved by the method illustrated in FIG. 10.

Figure 10A:
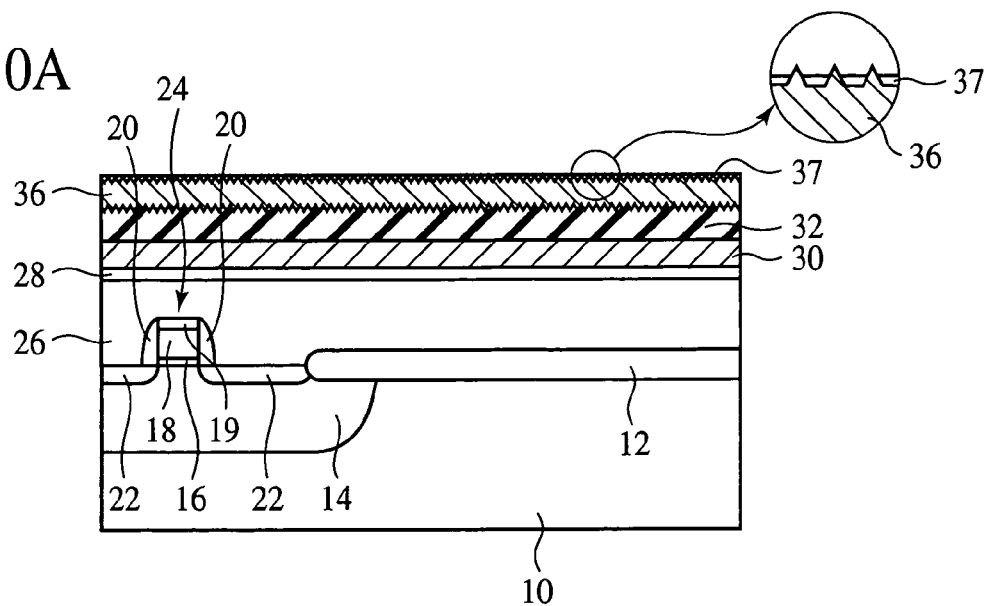
FIGS. 10A-10C are sectional views of the semiconductor device according to a second embodiment of the present invention in the steps of the method for fabricating the semiconductor device.

In the present embodiment, immediately after the conduction film 36 is formed, the conduction film 36 is not etched back, but a material of low viscosity, e.g., a 1-10 mPa·s (milli Pascal second) material is applied to the conduction film 36 by Sol-Gel process, i.e., spin coating to form a buried layer 37 (FIG. 10A). The concavities in the conduction film 36 are filled with the buried layer 37, and the convexities are exposed beyond the buried layer 37. The buried layer 37 is formed in a thickness, e.g., about 5-25 nm which allows the tops of the convexities in the surface of the conduction film 36 to be a little exposed.

The material to be buried which forms the buried layer 27 is, e.g., a resist material, a resist material having the sensitizer removed, a dielectric material, a silicon oxide-based material (SiO2-based coating liquid) or others.

Figure 10B:
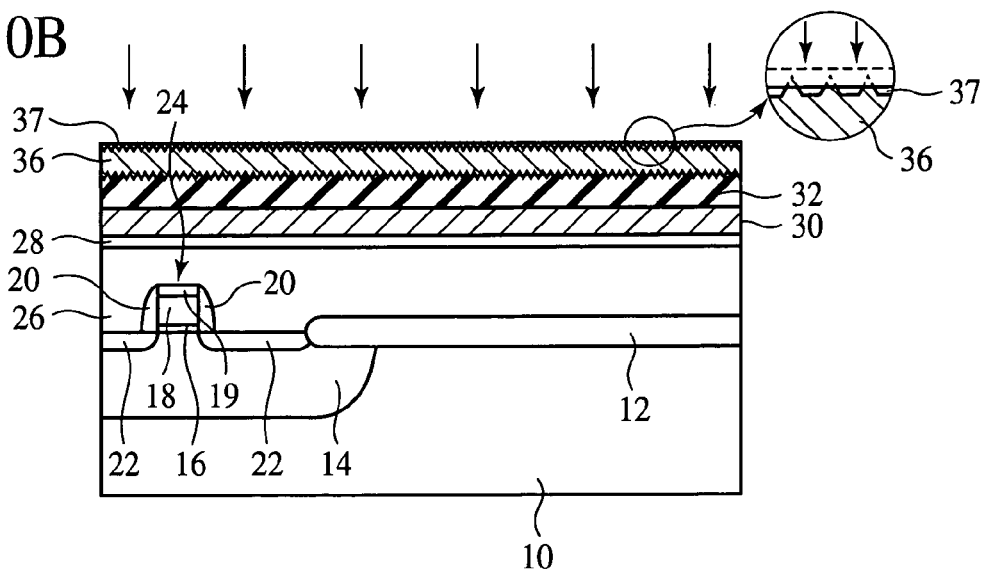

Then, the entire surface is anisotropically etched by, e.g., sputter etching to removed the tops of the convexities in the surface of the conduction film 36, which are exposed beyond the buried layer 37. At this time, the upper surface of the buried layer 37 is also etched off (FIG. 10B). The height of the convexities, which has been 10-20 nm, is reduced to about 3-5 nm, and the surface is generally flattened.

Conditions for the sputter etching at this time are, e.g., chloride ($Cl_2$) gas and argon (Ar) gas as the etching gas, a 1400 W source power, for example, and an 800 W bias power, for example.

Figure 10C:
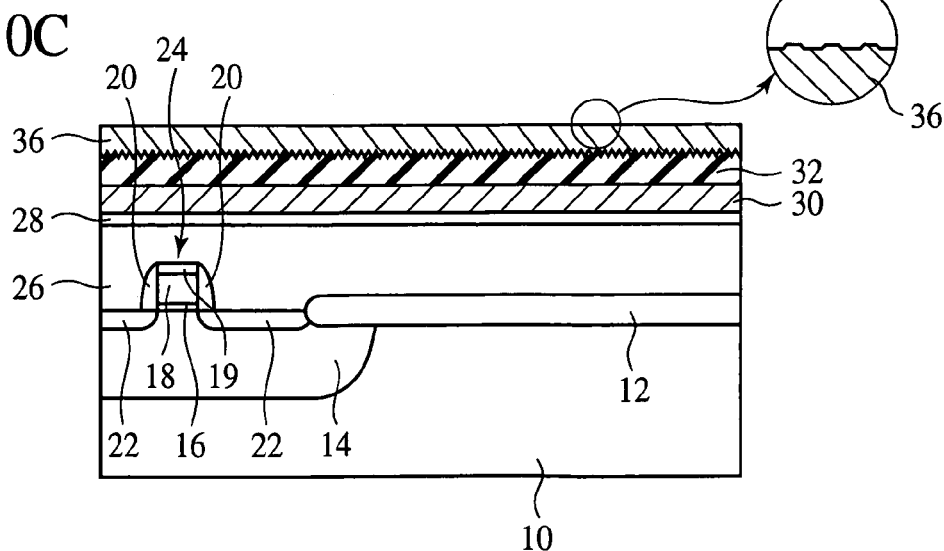

Then, the buried layer 37 remaining on the surface of the conduction film 36 is removed, and the entire flattened surface of the conduction film 36 is exposed (FIG. 10C). As the process for removing the buried layer 37, ashing is used for a resist material and a resist material having the sensitizer removed, and reactive ion etching (e.g., etching gas: $CF_4$+Ar+$C_4F_8$; power: 1000 W) is used for a silicon oxide-based coating material ($SiO_2$ based coating liquid).

Thus, the surface morphology of the conduction film 36 is improved.

As described above, in the present embodiment, the buried layer 37 is formed by applying a low-viscosity material to the conduction film 36 formed on the ferroelectric film 32 formed by MOCVD, then the entire surface is anisotropically etched to remove the tops of convexities in the surface of the conduction film, and then the buried layer remaining on the surface of the conduction film 36 is removed, whereby the surface morphology of the conduction film 36 can be improved. The surface morphology of the conduction film 36 is improved and flattened, which permits a desired pattern as designed to be formed by photolithography without the reflection of the incident exposure light in various directions.

A Third Embodiment

The method for fabricating a semiconductor device according to a third embodiment of the present invention will be explained with reference to FIG. 11. FIG. 11 is sectional views of the semiconductor device according to the present embodiment in the steps of the method for fabricating the semiconductor device, which illustrate the method.

The method for fabricating a semiconductor device according to the present embodiment is different from the second embodiment in the method for improving the surface morphology of the conduction film 36. In the present embodiment, the surface morphology of the conduction film 36 is improved by the method illustrated in FIG. 11.

Figure 11A:
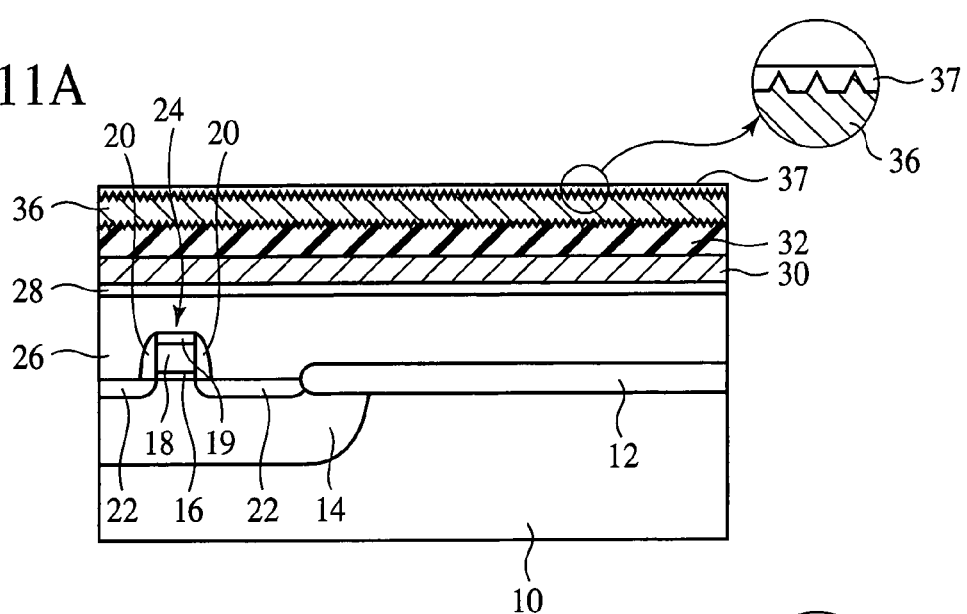
FIGS. 11A-11C are sectional views of the semiconductor device according to a third embodiment of the present invention in the steps of the method for fabricating the semiconductor device.

First, a material of low viscosity, e.g., a 1-10 mPa·s (milli-Pascal second) material is applied to the conduction film 36 by Sol-Gel process, i.e., spin coating to form a buried layer 37 (FIG. 11A). Concavities and convexities in the conduction film 36 are buried in the buried layer 37. The buried layer 37 is formed in a thickness, e.g., about 8-18 nm which allows the convexities in the surface of the conduction film 36 as well to be buried in the buried layer 37.

The material to be buried which forms the buried layer 27 is, e.g., a resist material, a resist material having the sensitizer removed, a dielectric material, a silicon oxide-based material ($SiO_2$ based coating liquid) or others.

Figure 11B:
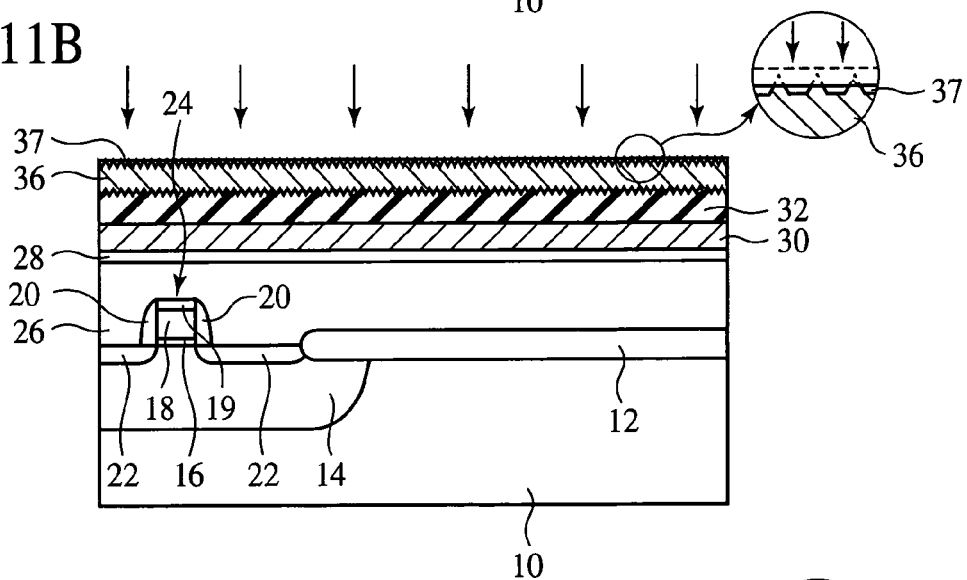
Figure 11C:
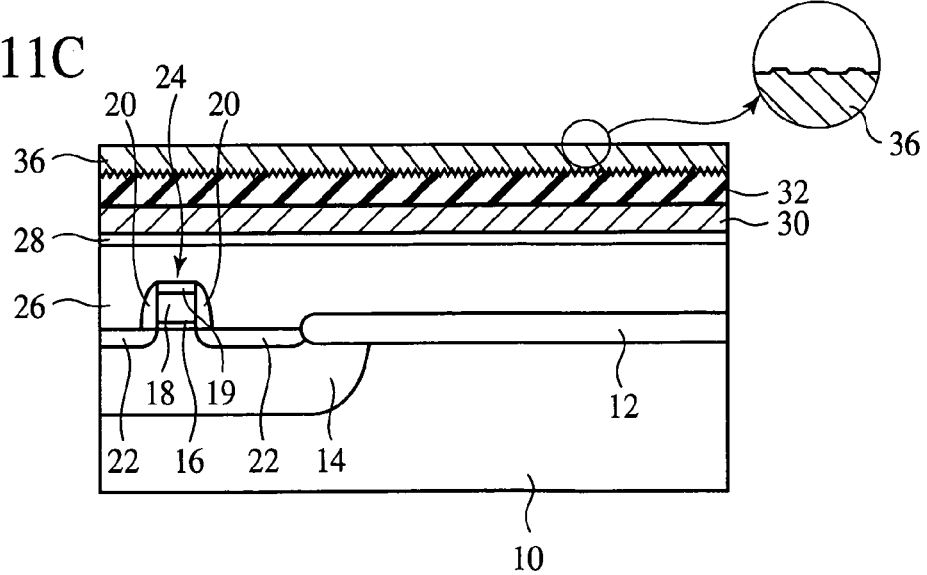

Then, the entire surface is anisotropically etched by, e.g., sputter etching. The entire surface of the buried layer 37 is first etched back, and subsequently, when convexities in the conduction film 36 are exposed beyond the buried layer 37, the tops of the exposed convexities in the surface of the conduction film 36 are removed (FIG. 11B). The height of the convexities which has been 10-20 nm is thus reduced to about 3-5 nm, and the surface is generally flattened.

Conditions for the sputter etching at this time are, e.g., chloride ($Cl_2$) gas and argon (Ar) gas as the etching gas, a 1400 W source power, for example, and an 800 W bias power, for example.

Then, when the buried layer 37 remaining on the surface of the conduction film 36 is removed, the entire flattened surface of the conduction film 36 is exposed (FIG. 10C).

As described above, in the present embodiment, the buried layer 37 is formed by applying a low-viscosity material to the conduction film 36 formed on the ferroelectric film 32 formed by MOCVD, then the entire surface is anisotropically etched to remove the tops of convexities in the surface of the conduction film, and then the buried layer remaining on the surface of the conduction film 36 is removed, whereby the surface morphology of the conduction film 36 can be improved. The surface morphology of the conduction film 36 is improved and flattened, which permits a desired pattern as designed to be formed by photolithography without the reflection of the incident exposure light in various directions.

Modified Embodiments

The present invention is not limited to the above-described embodiments and can cover other various modifications.

For example, in the above-described embodiments, the ferroelectric film 38 is formed of PZT film. However, the ferroelectric film 38 is not essentially PZT film and can be suitably any other ferroelectric film. For example, the ferroelectric film 38 can be $Pb_{1-x}La_xZr_{1-y}Ti_yO_3$ film (PLZT film), $SrBi_2(Ta_xNb_{1-x})_2O_9$ film, $Bi_4Ti_2O_{12}$ film or others.

In the above-described embodiments, the lower electrode 30 is formed of Pt film. However, the material of the lower electrode 30 is not limited to the material, and the lower electrode 30 may be formed of, e.g., Ir film, $IrO_2$ film, Ru film, $RuO_2$ film, SrRuO (strontium ruthenium oxide) film (SRO film), Pd film or a layer film of these films.

In the above-described embodiments, the upper electrode 36 is formed of $IrO_x$ film. However, the material of the conduction film, etc. forming the upper electrode 36 is not limited to the material, and the upper electrode 36 may be formed of, e.g., Ir film, Ru film, $RuO_2$ film, SRO film, Pd film or a layer film of these films.

In the above-described embodiments, the insulation film forming the inter-layer insulation film is silicon oxide film. However, various insulation films may be formed in place of silicon oxide film.

In the above-described embodiments, the method for flattening the surface of the insulation film forming the inter-layer insulation film is CMP. However, the method for flattening the surface of the insulation film is not essentially CMP, and the surface of the insulation film may be flattened by, e.g., etching. The etching gas can be, e.g., Ar gas.

In the above-described embodiments, the memory cell of 1T1C type comprising 1 transistor 24 and 1 ferroelectric capacitor 42 is fabricated. However, the memory cell is not essentially of 1T(Transisiter) 1C(Cell)-type. The memory cell can be not only of 1T1C type but also of various types, e.g., 2T(Transistor) 2C(Cell)-type comprising 2 transistors and 2 ferroelectric capacitors.

In the above-described embodiments, the semiconductor device has the FeRAM structure including a planar cell. However, the application of the present invention is not limited to the semiconductor device. For example, the present invention is applicable to semiconductor devices of the FeRAM structure including a stacked cell and having the gate length set at, e.g., 0.18 μm.

What is claimed is:

1. A method for fabricating a semiconductor device comprising the steps of:
    forming a ferroelectric film by metal organic chemical vapor deposition;
    forming a conduction film on the ferroelectric film; and
    flattening the cavities and convexities formed in the surface of the conduction film to improve surface morphology of the conduction film by etching the surface of the conduction film.

2. A method for fabricating a semiconductor device according to claim 1, wherein
    in the step of flattening the surface of the conduction film, the surface of the conduction film is anisotropically etched.

3. A method for fabricating a semiconductor device according to claim 2, wherein
    in the step of flattening the surface of the conduction film, the surface of the conduction film is plasma etched.

4. A method for fabricating a semiconductor device comprising the steps of:
    forming a ferroelectric film by metal organic chemical vapor deposition;
    forming a conduction film on the ferroelectric film;
    forming a buried layer for filling concavities in the surface of the conduction film;
    removing tops of convexities in a surface of the conduction film by etching from above the buried layer to flatten the surface of the conduction film; and
    removing the buried layer remaining on the surface of the conduction film.

5. A method for fabricating a semiconductor device according to claim 4, wherein
    in the step of forming the buried layer, the buried layer is formed in a thickness which allows the convexities in the surface of the conduction film to be exposed beyond the buried layer.

6. A method for fabricating a semiconductor device according to claim 4, wherein
    in the step of forming the buried layer, the buried layer is formed in a thickness which allows the convexities in the surface of the conduction film to be buried in the buried layer.

7. A method for fabricating a semiconductor device according to claim 4, wherein
    in the step of forming the buried layer, a burying material for burying the convexities in the surface of the conduction film is applied by spin coating.

8. A method for fabricating a semiconductor device according to claim 7, wherein
    the burying material is a resist material, a dielectric material or a silicon oxide-based material.

9. A method for fabricating a semiconductor device according to claim 4, wherein
    in the step of flattening the surface of the conduction film, anisotropic etching is made from above the buried layer.

10. A method for fabricating a semiconductor device according to claim 1, wherein
    the ferroelectric film is a film selected from the group consisting of $PbZr_{1-x}Ti_xO_3$ film (0<X<1), $Pb_{1-x}La_xZr_{1-y}Ti_yO_3$ film (0<X<1), (0<Y<1), $SrBi_2(Ta_xNb_{1-x})_2O_9$ film (0<X<1) and $Bi_4Ti_2O_{12}$ flm.

11. A method for fabricating a semiconductor device according to claim 4, wherein
    the ferroelectric film is a film selected from the group consisting of $PbZr_{1-x}Ti_xO_3$ film (0<X<1), $Pb_{1-x}La_xZr_{1-y}Ti_yO_3$ film (0<X<1), (0<Y<1), $SrBi_2(Ta_xNb_{1-x})_2O_9$ film (0<X<1) and $Bi_4Ti_2O_{12}$ flm.

12. A method for fabricating a semiconductor device according to claim 1, wherein
    the conduction film is a film selected from the group consisting of $IrO_2$ film, Ir film, Ru film, $RuO_2$ film, SRO film, Pd film and a layer film of these films.

13. A method for fabricating a semiconductor device according to claim 4, wherein
    the conduction film is a film selected from the group consisting of $IrO_2$ film, Ir film, Ru film, $RuO_2$ film, SRO film, Pd film and a layer film of these films.

14. A method for fabricating a semiconductor device according to claim 1, further comprising the steps of:
    forming a resist layer on the conduction film;
    exposing and developing the resist layer to pattern the resist layer; and
    etching the conduction film with the patterned resist layer as a mask to pattern the conduction film.

15. A method for fabricating a semiconductor device according to claim 4, further comprising the steps of:
   forming a resist layer on the conduction film;
   exposing and developing the resist layer to pattern the resist layer; and
   etching the conduction film with the patterned resist layer as a mask to pattern the conduction film.

* * * * *